United States Patent [19]
Ishizumi et al.

[11] Patent Number: 6,001,665
[45] Date of Patent: Dec. 14, 1999

[54] METHOD FOR PRODUCING SEMICONDUCTOR LASER DEVICE WITH HIGH GROWTH RATE FOR CAPPING LAYER

[75] Inventors: Takashi Ishizumi, Nara-ken; Shinji Kaneiwa, Nara, both of Japan

[73] Assignee: Sharp Kabushiki Kaisha, Osaka, Japan

[21] Appl. No.: 09/036,936

[22] Filed: Mar. 9, 1998

[30] Foreign Application Priority Data

Mar. 11, 1997 [JP] Japan ................................ 9-055744
Dec. 12, 1997 [JP] Japan ................................ 9-343400

[51] Int. Cl.$^6$ ................................................ H01L 21/20
[52] U.S. Cl. ........................... 438/46; 438/329; 438/41
[58] Field of Search ........................... 438/22, 37, 39, 438/40, 41, 42, 43, 44, 45, 46, 47; 372/43, 44, 45, 46, 47

[56] References Cited

U.S. PATENT DOCUMENTS 5,190,891 3/1993 Yokotsuka et al. .

OTHER PUBLICATIONS

Tanaka et al., Japanese Laid–Open Publication No. 6–77592, Laid open on Mar. 18, 1994 and English abstract thereof.
Morimoto et al., Japanese Laid–open Publication No. 8–32170, Laid open on Feb. 2, 1996 and English abstract thereof.
Ishibashi et al., Japanese Laid–Open Publication No. 6–188506, Laid open on Jul. 8, 1994 and English abstract thereof.

*Primary Examiner*—Charles Bowers
*Assistant Examiner*—K Christianson
*Attorney, Agent, or Firm*—Morrison & Foerster

[57] ABSTRACT

The present invention provides a method for producing a semiconductor laser device having at least a light emitting section, a cap layer and an electrode successively formed on a semiconductor substrate, the light emitting section including a light emitting layer located approximately in a middle of a thickness of the device. The method includes the step of growing the light emitting section and the cap layer using a vapor phase epitaxy method, wherein a growth rate of the cap layer is greater than a growth rate of the light emitting section.

6 Claims, 5 Drawing Sheets

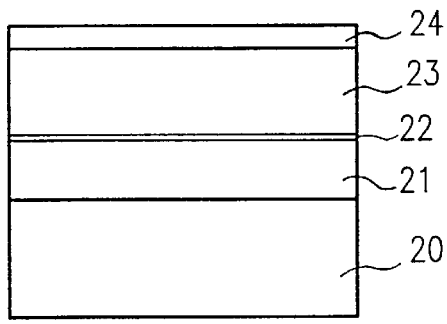
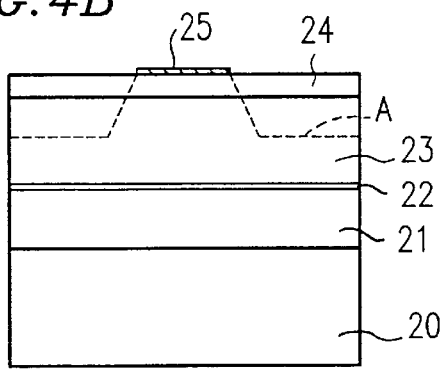
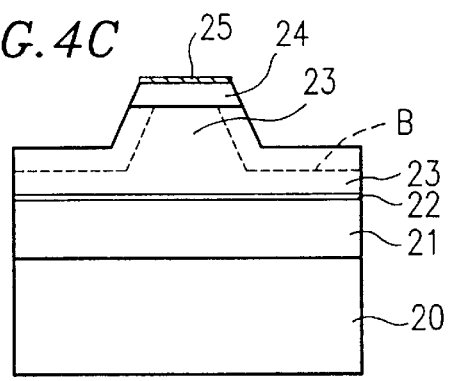
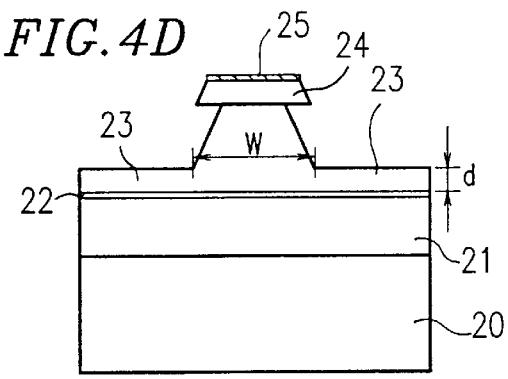
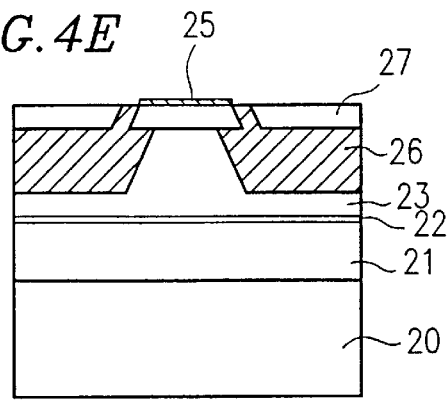
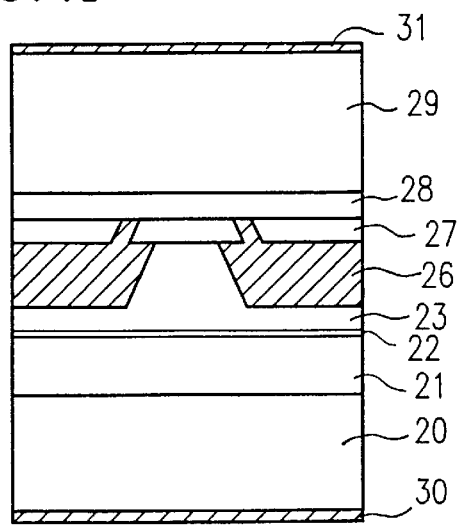

METHOD FOR PRODUCING SEMICONDUCTOR LASER DEVICE WITH HIGH GROWTH RATE FOR CAPPING LAYER

BACKGROUND OF THE INVENTION

1. Field of the Invention

The present invention relates to a method for producing a semiconductor laser device used as a light source for performing reading operations from an optical disk. More particularly, the present invention relates to a method for producing a semiconductor laser device using a vapor phase epitaxy (VPE) method, where the thickness of a cap layer is increased to reduce tracking errors due to return light.

2. Description of the Related Art

In recent years, optical disks such as CDs (Compact Disks) and MDs (Mini Disks) have rapidly become popular, as they can provide high sound quality without noise while they do not deteriorate through wear, in contrast to conventional analog records.

In an analog record, a pick up (the tip of a stylus) traces a groove on the record. In an optical disk, the pick up is not in contact with the disk, whereby it is necessary to detect positions of the signal pits and to move the pick up along the disk to detect the signal pits.

At present, the three beam tracking servo mode (hereinafter, "three beam mode") is widely used for this purpose, where light from a light source is divided into a main beam and primary diffraction light.

However, the three beam mode has the following problems.

As shown in FIG. 5, laser light 102 is emitted from a laser chip 100, passes through a diffraction grating 101, is reflected by a half mirror 103, passes through an objective lens 104, and is incident upon an optical disk 105. Reference numeral 106 denotes a stem upon which the laser chip 100 resides. Then, the reflected light returns through the same optical path to be received by a light receiving section (not shown) after passing through the half mirror 103. However, a portion of the reflected light returns back to an emission end face of the laser chip 100 through the diffraction grating 101. This portion of light is reflected again (indicated at "A" and "A" in FIG. 5) by the end face of the laser chip 100 ("A" in FIG. 5), which adversely influences the signal detection.

The position on the chip end face upon which the reflected primary diffraction light will be incident varies depending upon the optical system used, but is typically about 60 μm above or below the emission region.

Conventionally, to address this problem, the light emitting region (light emitting layer) of the laser chip 100 is located so that the primary diffraction light will not be incident upon the emission end face, as shown in FIG. 6A. Particularly, the light emitting region is located approximately in the middle of the semiconductor laser chip 100.

As shown in FIG. 6B, the specific thicknesses may be Le≦60 μm, Ls≦60 μm, where Le denotes the thickness of an epitaxial layer 101a above the light emitting region while Ls denotes the thickness of an epitaxial layer and the substrate below the light emitting region.

Herein, if the wafer thickness of the laser chip 100 is less than about 70 μm, a crack or a chip in the wafer may easily occur, which hinders the fabrication process. Therefore, there is provided an additional condition: Le+Ls≧70 μm.

Thus, the thickness Le of the epitaxial layer above the light emitting region will be 10 μm≦Le ≦60 μm.

The liquid phase epitaxy (LPE) method has been used to realize such a layer thickness in the conventional structure shown in FIGS. 6A and 6B. The LPE method has been used since it has a relatively high growth rate and is able to grow a thick film within a short period of time, thereby providing a better production efficiency, compared to the VPE method, which has a relatively low growth rate, thus requiring a longer period of time to grow a thick film.

However, in the LPE method, dopant impurities in the vicinity of the light emitting region diffuse due to the high growth temperature (up to about 800° C.). This diffusion factor deteriorates the performance of the product.

Moreover, a quantum well structure obtained by depositing thin films having thicknesses of several to around twenty μm, when exposed to such a high temperature, results in the migration of material atoms as well as the impurity diffusion, whereby the quantum well structure is destroyed. Thus, such a high temperature during the film growth phase hinders the production of a high performance semiconductor laser device using the quantum well structure.

SUMMARY OF THE INVENTION

According to one aspect of this invention, there is provided a method for producing a semiconductor laser device having at least a light emitting section, a cap layer and an electrode successively formed on a semiconductor substrate, the light emitting section including a light emitting layer located approximately in a middle of a thickness of the device. The method includes the step of growing the light emitting section and the cap layer using a vapor phase epitaxy method, wherein a growth rate of the cap layer is greater than a growth rate of the light emitting section.

In one embodiment of the invention, the cap layer includes two layers; and a growth rate of one of the two layers which is farther away from the light emitting section is greater than a growth rate of the light emitting section.

In another embodiment of the invention, a flow rate of a material gas flow when growing the cap layer is greater than a flow rate of a material gas flow when growing the light emitting section.

In still another embodiment of the invention, the semiconductor laser device is formed of a group III–V compound; and a molar ratio of a group V element to a group III element supplied when growing the cap layer is less than a molar ratio of another group V element to another group III element supplied when growing the light emitting section.

In still another embodiment of the invention, the semiconductor laser device is formed of a group III–V compound; and at least a molar ratio of a group V element to a group III element supplied when growing the one of the two layers which is farther away from the light emitting section is less than a molar ratio of another group V element to another group III element supplied when growing the light emitting section.

In still another embodiment of the invention, a growth temperature for the cap layer is about 550° C. to about 700° C. so that a carrier concentration in a portion of the cap layer which contacts the electrode is about $1 \times 10^{19}/cm^3$ or greater.

Hereinafter, the effects of the present invention will be described.

According to the present invention, the rate of vapor phase epitaxy of a cap layer, whose crystalline quality is not of great importance, is set to be higher (i.e., faster) than the growth rate of the light emitting section (e.g., by about 6-fold, as in Example 2 below). Thus, it is possible to reduce the total amount of time required for producing a device.

When forming the cap layer with two layers, it is only necessary to set the growth rate of at least one of the layers that is farther away from the light emitting section to be greater than that of the light emitting section. The growth rate of the other layer that is closer to the light emitting section may also be increased, or it may be about the same as that of the light emitting section. Particularly, when the growth rate of the cap layer closer to the light emitting section is about the same as that of the light emitting section, it is possible to suppress an influence on the crystallinity (e.g., defects in the cap layer closer to the light emitting section) of the light emitting section.

Specifically, the growth rate can be increased by increasing the flow rate of the material gas flow during the vapor phase epitaxy process.

Moreover, since the growth rate is generally proportional to the amount of the supplied group III element, it is possible to increase the growth rate by decreasing the molar ratio of a group V element to the group III element supplied during the vapor phase epitaxy process. For example, it is possible to improve the growth rate as well as to reduce the consumption of the supplied materials for forming the semiconductor layers by increasing the amount of the supplied group III element while setting the amount of the supplied group V element at a conventional level. When forming the cap layer with two layers, it is only necessary to set the molar ratio of the group V element to the group III element supplied during the formation of at least one of the layers that is farther away from the light emitting section to be less than that during the formation of the light emitting section.

Moreover, by setting the growth temperature of the cap layer to about 550° C. to about 700° C., which is about 100° C. to about 250° C. lower than the growth temperature in the LPE method (which is up to about 800° C.), it is possible to suppress the impurity diffusion in the vicinity of the light emitting region, to set the carrier concentration in the cap layer to be high, i.e., about $1 \times 10^{19}/cm^3$ or higher, and to improve the contact between the electrode and the cap layer.

Thus, the invention described herein makes possible the advantage of providing a method for efficiently producing a semiconductor laser device having a structure where the primary diffraction light returning from a disk is not again incident upon the device, without adversely influencing the performance of the semiconductor laser device.

This and other advantages of the present invention will become apparent to those skilled in the art upon reading and understanding the following detailed description with reference to the accompanying figures.

BRIEF DESCRIPTION OF THE DRAWINGS

FIGS. 4A to 4F are cross section diagrams which illustrate the steps for producing a semiconductor laser device according to Example 2 of the present invention.

DESCRIPTION OF THE PREFERRED EMBODIMENTS

EXAMPLE 1

Hereinafter, Example 1 of the present invention will be described with reference to FIGS. 1A to 1D. The feature of Example 1 is the employment of the VPE method while overcoming the long growth time, which has heretofore been the drawback of the VPE method.

Figure 1A:
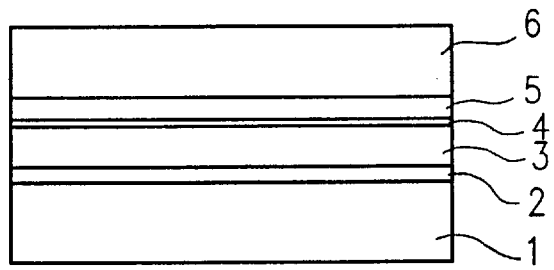
FIGS. 1A to 1D are cross section diagrams which illustrate the steps for producing a semiconductor laser device according to Example 1 of the present invention.

First, an N—GaAs substrate 1 is disposed on a susceptor in a reactor of a metalorganic vapor phase epitaxy (MOVPE) apparatus (not shown). Then, as shown in FIG. 1A, an N—GaAs buffer layer 2 (thickness: about 0.5 $\mu$m), an N—$Al_{0.5}Ga_{0.5}As$ cladding layer 3 (thickness: about 1.0 $\mu$m), an $Al_{0.14}Ga_{0.86}As$ active layer 4 (thickness: about 0.08 $\mu$m), a P—$Al_{0.5}Ga_{0.5}As$ cladding layer 5 (thickness: about 0.35 $\mu$m) and an N—GaAs current blocking layer 6 (thickness: about 0.6 $\mu$m) are formed in this order on the N—GaAs substrate 1, utilizing the MOVPE method.

In the formation of the N—GaAs buffer layer 2, trimethylgallium (TMG), arsine ($AsH_3$) and disilane ($Si_2H_6$) are supplied at flow rates of about 340 $\mu$mol/min for TMG, about 20000 $\mu$mol/min for arsine, and about $9 \times 10^{-4}$ $\mu$mol/min for disilane. In the formation of the N—$Al_{0.5}Ga_{0.5}As$ cladding layer 3, trimethylaluminum (TMA), TMG, arsine and disilane are supplied at flow rates of about 170 $\mu$mol/min for TMA, about 170 $\mu$mol/min for TMG, about 20000 $\mu$mol/min for arsine, and about $6 \times 10^{-4}$ $\mu$mol/min for disilane. In the formation of the $Al_{0.14}Ga_{0.86}As$ active layer 4, TMA, TMG and arsine are supplied at flow rates of about 47.6 $\mu$mol/min for TMA, about 292.4 $\mu$mol/min for TMG and about 20000 $\mu$mol/min for arsine. In the formation of the P—$Al_{0.5}Ga_{0.5}As$ cladding layer 5, TMA, TMG, arsine and diethylzinc (DEZ) are supplied at flow rates of about 170 $\mu$mol/min for TMA, about 170 $\mu$mol/min for TMG, about 20000 $\mu$mol/min for arsine, and about 45 $\mu$mol /min for DEZ. In the formation of the N—GaAs current blocking layer 6, TMG, arisine and disilane are supplied at flow rates of about 340 $\mu$mol/min for TMG, about 20000 $\mu$mol/min for arsine, and about $1.5 \times 10^{-3}$ $\mu$mol/min for disilane.

The conditions under which these layers are grown include a growth temperature of about 700° C., a growth rate of about 0.05 $\mu$m/min, and a molar ratio of a group V element to a group III element of about 60.

Figure 1B:
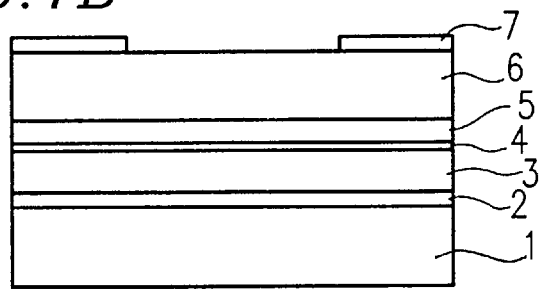

Then, the multi-layer structure is taken out of the MOVPE apparatus, and a photoresist 7 is applied on the surface of the multi-layer structure, followed by a photolithography process (see FIG. 1B).

Figure 1C:
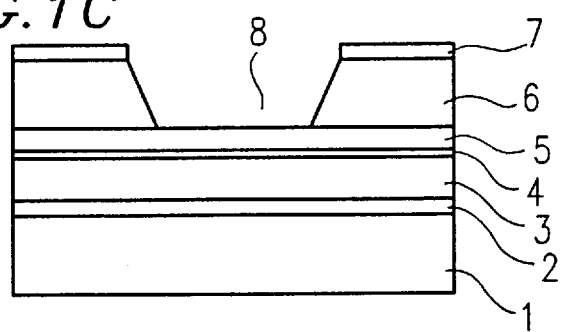

Subsequently, the N—GaAs current blocking layer 6 is selectively etched using an etchant which provides a much slower etching rate for AlGaAs than for GaAs, such as a solution having a ratio of $NH_4OH:H_2O_2:H_2O=1:30:50$. An exemplary etching condition when using this etchant includes a temperature of about 20° C. and an etching time of about 30 seconds. Such an etching process forms a groove 8, as shown in FIG. 1C, which separates the N—GaAs current blocking layer 6 into two portions and reaches the upper surface of the P—$Al_{0.5}Ga_{0.5}As$ cladding layer 5.

Thereafter, the resist is removed by a known method, e.g., using acetone→methanol→water.

Figure 1D:
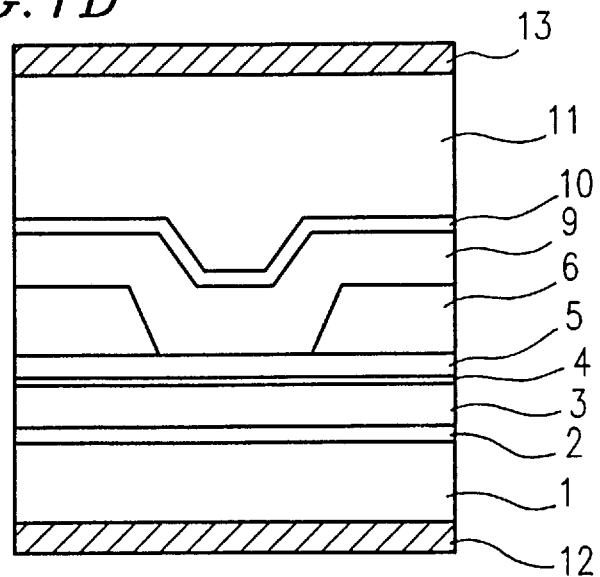

Next, the above multi-layer structure is set in the reactor of the MOVPE apparatus. Then, as shown in FIG. 1D, a P—$Al_{0.5}Ga_{0.5}As$ cladding layer 9 (thickness: about 1.0 $\mu$m, growth temperature: about 650° C., growth rate: about 0.05 µm/min, molar ratio of the group V element to the group III element: about 60), a first P—GaAs cap layer 10 (thickness: about 2 µm, growth temperature: about 650° C., growth rate: about 0.05 µm/min, molar ratio of the group V element to the group III element: about 60), and a second P—GaAs cap layer 11 (thickness: about 50 µm, growth temperature: about 600° C., growth rate: about 0.3 µm/min, molar ratio of the group V element to the group III element: about 10) are formed in this order on the multi-layer structure of FIG. 1C, using the MOVPE method.

In the formation of the P—$Al_{0.5}Ga_{0.5}As$ cladding layer 9, TMA, TMG, arsine and DEZ are supplied at flow rates of about 170 µmol/min for TMA, about 170 µmol/min for TMG about 20000 µmol/min for arsine, and about 180 µmol/min for DEZ. In the formation of the first P—GaAs cap layer 10, TMG, arsine and DEZ are supplied at flow rates of about 340 µmol/min for TMG, about 20000 µmol/min for arsine, and about 180 µmol/min for DEZ. In the formation of the second P—GaAs cap layer 11, TMG, arsine and DEZ are supplied at flow rates of about 2040 µmol/min for TMG, about 20000 µmol/min for arsine, and about 45 µmol /min for DEZ.

Figure 2:
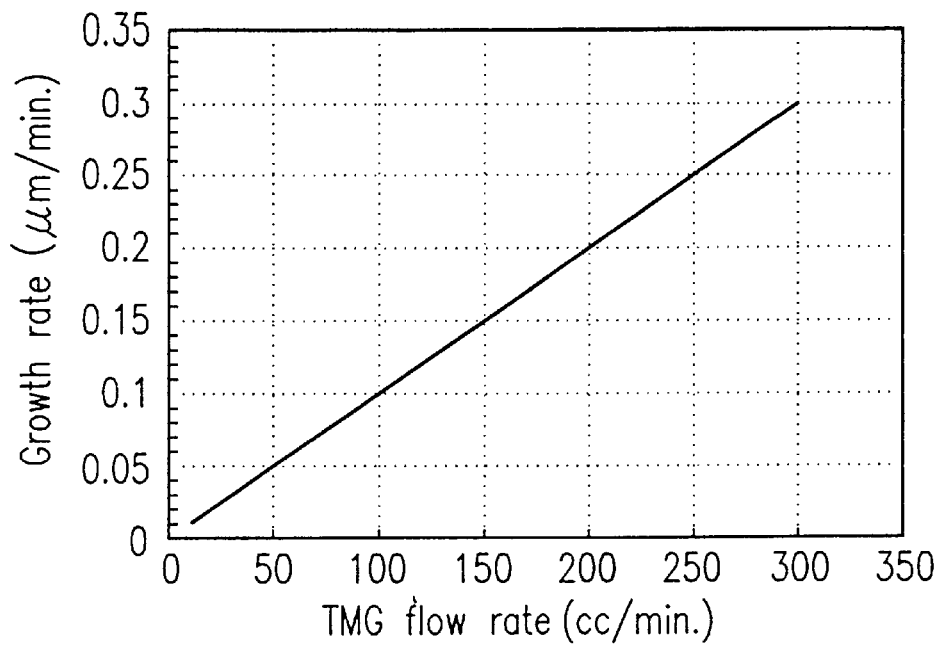
FIG. 2 is a graph showing the relationship between the material gas flow rate and the growth rate.

During the formation of the second P—GaAs cap layer 11, the flow rate of the group III metalorganic material is high so as to achieve a high film growth rate. The relationship between the TMG flow rate and the film growth rate of the second cap layer is shown in FIG. 2. In Example 1, the above-described growth rate of about 0.3 µm/min is realized by flowing TMG at about 300 cc/min.

Figure 3:
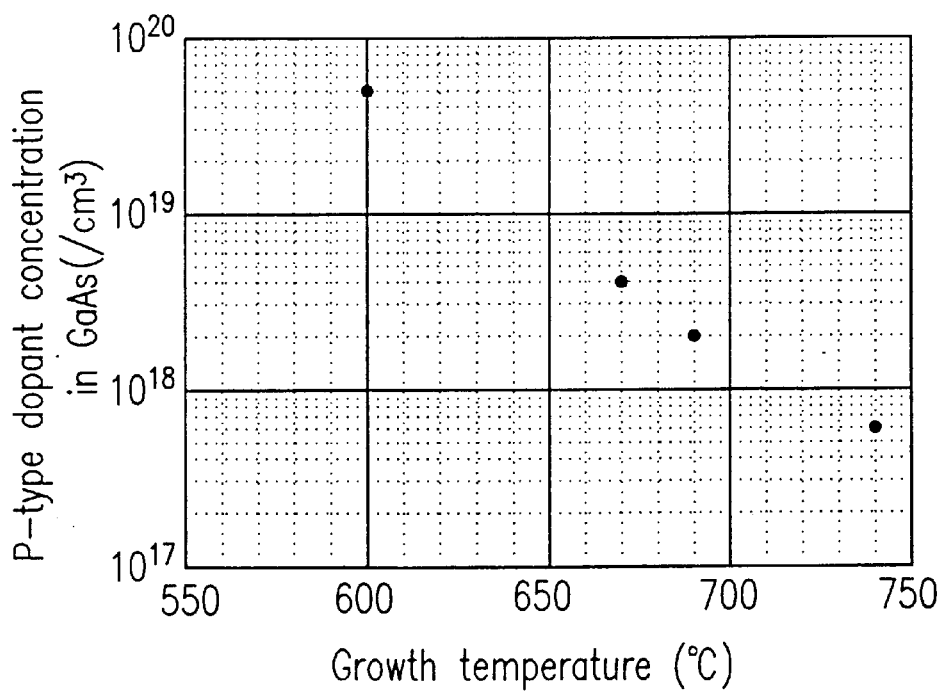
FIG. 3 is a graph showing the temperature dependency of the carrier concentration.
Figure 5:
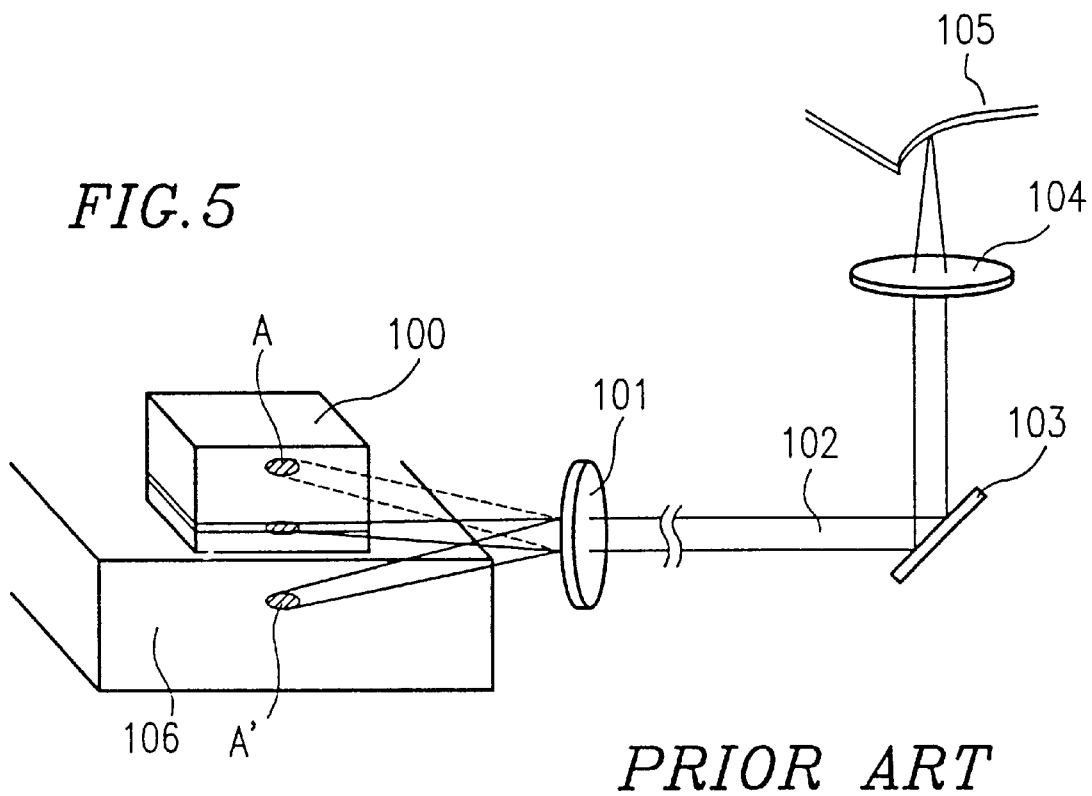
FIG. 5 is a schematic diagram illustrating an optical pick up method using a conventional semiconductor laser device.
Figure 6A:
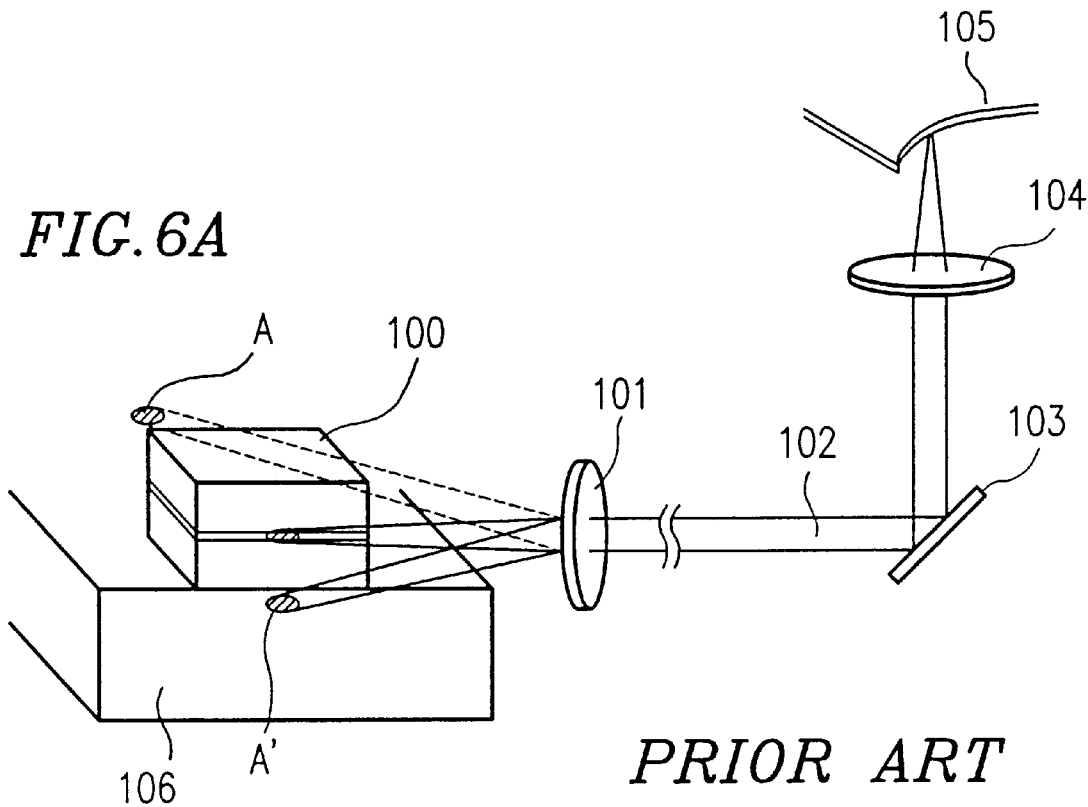
FIG. 6A is a schematic diagram illustrating another optical pick up method using another conventional semiconductor laser device which overcomes the problems associated with the device of FIG. 5.
Figure 6B:
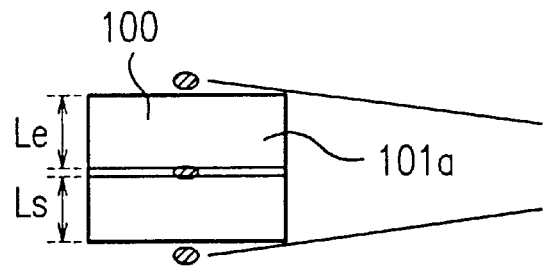
FIG. 6B is an enlarged view illustrating a part of the semiconductor laser device of FIG. 6A.

The lower the growth rate of the film, the more easily Zn, as a P-type dopant for GaAs, diffuses into the GaAs crystal lattice. Under the above-described growth condition for the second P—GaAs cap layer 11, the P-type dopant concentration in the GaAs is about $5 \times 10^{19}/cm^3$. The relationship between the growth temperature and the P-type carrier concentration in the GaAs is shown in FIG. 3.

Then, the multi-layer structure is taken out of the MOVPE apparatus, and the N—GaAs substrate 1 is polished so as to achieve a total device thickness of about 100 µm. Thereafter, electrodes 12 and 13 are formed, respectively, on the surface of the N—GaAs substrate 1 and the second P—GaAs cap layer 11. After forming the electrodes, the device is cleft to a predetermined cavity length, and an insulating film (not shown) having a predetermined reflectance is formed on the cleft face, after which the device is divided into chips of a predetermined size. Then, the chip is bonded to a laser stem, and a Au conductive wire is bonded to the upper surface of the chip.

In the chip produced through the above-described steps, the thickness of the epitaxial layer above the light emitting region (i.e., the active layer 4 and the P-type cladding layer 5) is about 50 µm, and the thickness of the substrate and the epitaxial layer below the light emitting region is also about 50 µm.

Therefore, even when the primary diffraction light for the tracking servo is reflected and returns back to the disk, such light will not be incident upon the chip emission end face (cleft face), thus avoiding tracking errors.

As described above, in the method for producing a semiconductor laser device utilizing the VPE method according to Example 1 of the present invention, the growth rate of the cap layer 11, whose crystalline quality, even when deteriorated, does not directly influence the laser oscillation characteristics, is set to be greater than that in the conventional VPE method. Thus, it is possible to reduce the total amount of time required for producing a device, thereby improving the productivity.

Generally, in a laser device, the crystalline quality is important in a light emitting region including an active layer or a cladding layer. In Example 1, the growth rate is increased for the cap layer 11 which contacts the electrode metal 13. Therefore, it is only necessary to have a sufficiently low resistance between the cap layer 11 and the electrode 13, and the crystalline quality is not of great importance in the cap layer 11.

In order to have a low resistance between the cap layer 11 and the electrode 13, it is necessary to maintain the carrier concentration in the cap layer 11 at a high level (about $1 \times 10^{19}/cm^3$ or higher). In the VPE method, as the growth temperature decreases, the P-type carrier concentration increases.

In view of this, according to the present invention, the cap layers 10 and 11 are grown at a low temperature (about 550° C. to about 700° C., which is about 100° C. to about 250° C. lower than the growth temperature in the LPE method; in Example 1, about 600° C. to 650° C.). As described above, it is possible to have a high P-type carrier concentration in the cap layer, thereby realizing an excellent contact. Thus, a high performance semiconductor laser device is obtained.

It is possible to also decrease the growth temperature and/or the molar ratio of the group V element to the group III element of the first cap layer 10, as well as those of the second cap layer 11.

EXAMPLE 2

Hereinafter, a method for producing a semiconductor laser device according to Example 2 of the present invention will be described with reference to FIGS. 4A to 4F. Example 2 also employs the VPE method while overcoming the long growth time, which has been heretofore been the drawback of the VPE method.

First, a N—GaAs substrate 20 is disposed on a susceptor in a reactor of a MOVPE apparatus (not shown). Then, as shown in FIG. 4A, an N—$Al_yGa_{1-y}As$ cladding layer 21 ($0.3 \leq y \leq 0.6$, thickness: about 1.0 µm), an $Al_xGa_{1-x}As$ active layer 22 ($0 \leq x \leq 0.2$, thickness: about 0.08 µm, y>x), a P—$Al_yGa_{1-y}As$ cladding layer 23 (thickness: about 1 µm) and a P—GaAs protecting layer 24 (thickness: about 0.6 µm) are formed in this order on the N—GaAs substrate 20, utilizing the MOVPE method.

In the formation of the N—$Al_yGa_{1-y}As$ cladding layer 21, TMA, TMG, arsine and disilane are supplied at flow rates of about 340×y µmol/min for TMA, about 340×(1−y) µmol/min for TMG, about 20000 µmol/min for arsine, and about $6 \times 10^{-4}$ µmol/min for disilane. In the formation of the $Al_xGa_{1-x}As$ active layer 22, TMA, TMG and arsine are supplied at flow rates of about 340×x µmol/min for TMA, about 340×(1−x) µmol/min for TMG and about 20000 µmol/min for arsine. In the formation of the P—$Al_yGa_{1-y}As$ cladding layer 23, TMA, TMG, arsine and DEZ are supplied at flow rates of about 340×y µmol/min for TMA, about 340×(1−y) µmol/min for TMG, about 20000 µmol/min for arsine, and about 45 µmol/min for DEZ. In the formation of the P—GaAs protecting layer 24, TMG, arsine and DEZ are supplied at flow rates of about 340 µmol/min for TMG, about 20000 µmol/min for arsine, and about 90 µmol/min for DEZ.

The conditions under which these layers are grown include a growth temperature of about 700° C., a growth rate of about 0.05 µm/min, and a molar ratio of the group V element to the group III element of about 60.

Then, the multi-layer structure is taken out of the MOVPE apparatus, and a photoresist is applied on the surface of the multi-layer structure. Thereafter, a photolithography process is performed so as to form a stripe-shaped etching mask 25, as shown in FIG. 4B. Then, an etching process is performed down to dotted line A in FIG. 4B. Normally, a wet etching process with a mixture of sulfuric acid and hydrogen peroxide is employed for this etching process.

Then, another etching process is performed with a hydrofluoric acid solution down to dotted line B, as shown in FIG. 4C. The P—GaAs protecting layer 24 is not etched by the hydrofluoric acid solution, and the two side faces below the ridge of the layer 24 are simultaneously etched, as shown in FIGS. 4C and 4D, thus leaving the P—$Al_yGa_{1-y}As$ cladding layer 23 with a thickness "d" of about 0.2 μm and a width "w" of about 2 μm at the bottom of the ridge.

Subsequently, the multi-layer structure is disposed in the MOVPE apparatus so as to deposit, utilizing the MOVPE method, an N—GaAs or N—$Al_zGa_{1-z}As$ current blocking layer 26 ($0 \leq z \leq 0.8$, thickness: about 0.8 μm) and an N—GaAs flattening layer 27 (thickness: about 0.6 μm), as shown in FIG. 4E. It is possible to prevent growth on the etching mask 25 by utilizing the growth selectivity in the vapor phase epitaxy.

In the formation of the N—GaAs current blocking layer 26, TMG, arsine and disilane are supplied at flow rates of about 340 μmol/min for TMG, about 20000 μmol/min for arsine, and about $1.5 \times 10^{-3}$ μmol/min for disilane. In the formation of the N—$Al_zGa_{1-z}As$ current blocking layer 26, TMA, TMG, arsine and disilane are supplied at flow rates of about 340×z μmol/min for TMA, about 340×(1−z) μmol/min for TMG about 20000 μmol/min for arsine, and about $1.5 \times 10^{-3}$ μmol/min for disilane. In the formation of the N—GaAs flattening layer 27, TMG, arsine and disilane are supplied at flow rates of about 340 μmol/min for TMG, about 20000 μmol/min for arsine, and about $1.5 \times 10^{-3}$ μmol /min for monosilane.

The growth conditions are, again, a growth temperature of about 700° C., a growth rate of about 0.05 μm/min, and a molar ratio of the group V element to the group III element of about 60.

When the current blocking layer 26 is formed of N—GaAs or N—$Al_zGa_{1-z}As$, and z<x, the device will be a loss guide structure based on the optical absorption by the current blocking layer 26. If z>y, it will be a real refractive index guide structure.

Then, after removing the etching mask 25, a first P—GaAs cap layer 28 (thickness: about 0.5 μm, growth temperature: about 650° C., growth rate: about 0.05 μm/min, molar ratio of the group V element to the group III element: about 60), and a second P—GaAs cap layer 29 (thickness: about 45 μm, growth temperature: about 600° C., growth rate: about 0.3 μm/min, molar ratio of the group V element to the group III element: about 10) are deposited, as shown in FIG. 4F, utilizing the MOVPE method.

In the formation of the first P—GaAs cap layer 28, TMG, arsine and DEZ are supplied at flow rates of about 340 μmol/min for TMG, about 20000 μmol/min for arsine, and about 180 μmol/min for DEZ. In the formation of the second P—GaAs cap layer 29, TMG, arsine and DEZ are supplied at flow rates of about 2040 μmol/min for TMG, about 20000 μmol/min for arsine, and about 45 μmol /min for DEZ.

During the formation of the second P—GaAs cap layer 29, the amount of the supplied group V element is set to be about the same as that when forming the other layers, while setting the amount of the supplied group III element to be about six times as great as that when forming the other layers. Since the growth rate is generally proportional to the amount of the supplied group III element, the growth rate of the second P—GaAs cap layer 29 is about six times as great as that when forming the other layers.

Decreasing the growth temperature to be as low as about 600° C. provides an effect of increasing the rate at which Zn, as a P-type dopant, diffuses into a crystal lattice. In Example 2, the carrier concentration of the second P—GaAs cap layer 29 is about $5 \times 10^{19}/cm^3$.

Then, the multi-layer structure is taken out of the MOVPE apparatus, and is etched or polished, from the side of the N—GaAs substrate 20, so as to achieve a thickness of the entire wafer of about 100 μm. Thereafter, electrodes 30 and 31 are formed, respectively, on the surface of the N—GaAs substrate 20 and the second P—GaAs cap layer 29. Thus, a semiconductor laser device is completed, as shown in FIG. 4F.

In the semiconductor laser device produced through the above-described steps, the thickness of the epitaxial layer above the light emitting region is about 50 μm, and the thickness of the substrate and the epitaxial layer below the light emitting region is also about 50 μm.

Therefore, even when the primary diffraction light for tracking servo is reflected and returns back to the disk, such light will not be incident upon the chip emission end face (cleft face), thus avoiding tracking errors.

As described above, in the method for producing a semiconductor laser device utilizing the VPE method according to Example 2 of the present invention, the growth rate for forming the second P—GaAs cap layer 29, which has the largest thickness of about 45 μm, is increased to be about six times as great as that in the conventional VPE method. Thus, it is possible to reduce the total amount of time required for producing a device.

Moreover, since the amount of the supplied group V element is set to be about the same as that in the conventional VPE method, it is possible to reduce the consumption of supplied materials for forming the semiconductor layers.

Generally, the higher the growth temperature is and/or the greater the molar ratio of the group V element to the group III element is, the better the crystalline quality will be. In view of this, in Example 2, the layers in the light emitting region (e.g., the active layer and the cladding layer) are grown under conditions, where high crystalline quality can be realized, including a growth temperature of about 700° C. and a molar ratio of the group V element to the group III element of about 60. Thus, the obtained semiconductor laser characteristics are not inferior to those of the conventional semiconductor laser device.

On the other hand, the growth conditions for the second P—GaAs cap layer 29 include a growth temperature of about 600° C. and a molar ratio of the group V element to the group III element of about 10, thereby resulting in a slightly lower crystalline quality. However, the function of the second P—GaAs cap layer 29 is to obtain a large thickness and to achieve an ohmic contact, and therefore the layer 29 does not have to be a high quality crystal. Moreover, in the VPE method, as the growth temperature decreases, the P-type carrier concentration increases. Therefore, the growth temperature, which is as low as about 600° C., provides an effect of reducing the resistance between the second cap layer 29 and the P-type electrode 31. In Example 2, the serial resistance of the semiconductor laser device is as low as about 3 Ω to about 5 Ω (the same level as in a semiconductor laser device produced by the LPE method).

Regarding the conditions under which the second cap layer 29 is grown, there is no adverse influence on the semiconductor laser device characteristics when the growth temperature is decreased down to about 550° C. and/or the molar ratio of the group V element to the group III element is decreased down to about 5. It is applicable to also decrease the molar ratio of the group V element to the group III element when forming the first P—GaAs cap layer 28 to be about the same as that when forming the second cap layer 29.

Production of an AlGaAs type semiconductor laser device has been described in Examples 1 and 2 above. However, the present invention can also be applied to other cases where different materials are used. In the case of a device employing the quantum well structure for the active layer, a high temperature as those experienced in the LPE method would destroy the quantum well structure. In such a case, it is particularly advantageous to grow the cap layer at a low temperature, as in the present invention.

Although the MOVPE method is used as the VPE method in the above-described examples, other VPE methods can also be employed, such as a hydride vapor phase epitaxy or a chloride vapor phase epitaxy.

As described above, it is possible to produce a high performance semiconductor laser device in which, even when the primary diffraction light for tracking servo is reflected and returns back to the laser device, such light will not be incident upon the chip emission end face, thus avoiding tracking errors. Moreover, the production requires a reduced amount of time and is efficient, as compared to the conventional method, thereby improving the productivity of the fabrication process.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor laser device having at least a light emitting section, a cap layer and an electrode successively formed on a semiconductor substrate, the light emitting section including a light emitting layer located approximately in a middle of a thickness of the device, the method comprising the step of:

growing the light emitting section and the cap layer using a vapor phase epitaxy method, wherein a growth rate of the cap layer is greater than a growth rate of the light emitting section.

2. A method for producing a semiconductor laser device according to claim 1, wherein:

the cap layer includes two layers; and a growth rate of one of the two layers which is farther away from the light emitting section is greater than a growth rate of the light emitting section.

3. A method for producing a semiconductor laser device according to claim 1, wherein:

a flow rate of a material gas flow when growing the cap layer is greater than a flow rate of a material gas flow when growing the light emitting section.

4. A method for producing a semiconductor laser device according to claim 1, wherein:

the semiconductor laser device is formed of a group III–V compound; and a molar ratio of a group V element to a group III element supplied when growing the cap layer is less than a molar ratio of another group V element to another group III element supplied when growing the light emitting section.

5. A method for producing a semiconductor laser device according to claim 2, wherein:

the semiconductor laser device is formed of a group III–V compound; and at least a molar ratio of a group V element to a group III element supplied when growing the one of the two layers which is farther away from the light emitting section is less than a molar ratio of another group V element to another group III element supplied when growing the light emitting section.

6. A method for producing a semiconductor laser device according to claim 1, wherein:

a growth temperature for the cap layer is about 550° C. to about 700° C. so that a carrier concentration in a portion of the cap layer which contacts the electrode is about $1 \times 10^{19}/cm^3$ or greater.

* * * * *